United States Patent
Zhang et al.

(10) Patent No.: US 12,401,335 B2
(45) Date of Patent: Aug. 26, 2025

(54) INTEGRATED TRANSIMPEDANCE AMPLIFIER WITH A DIGITAL SIGNAL PROCESSOR FOR HIGH-SPEED OPTICAL RECEIVERS

(71) Applicant: Avago Technologies International Sales Pte. Limited, Singapore (SG)

(72) Inventors: Jiawen Zhang, Irvine, CA (US); Delong Cui, Tustin, CA (US); Afshin Momtaz, Laguna Hills, CA (US); Kun Chuai, Laguna Niguel, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 18/335,217

(22) Filed: Jun. 15, 2023

(65) Prior Publication Data
US 2024/0154591 A1    May 9, 2024

Related U.S. Application Data

(63) Continuation of application No. 17/980,478, filed on Nov. 3, 2022, now Pat. No. 11,722,109.

(51) Int. Cl.
*H03F 3/45*      (2006.01)
*G01J 1/44*      (2006.01)
*H03G 3/30*      (2006.01)

(52) U.S. Cl.
CPC ........... *H03F 3/45475* (2013.01); *G01J 1/44* (2013.01); *H03G 3/30* (2013.01); *H03F 2200/372* (2013.01); *H03G 2201/103* (2013.01)

(58) Field of Classification Search
CPC .......... H03F 3/45475; H03F 2200/372; H03G 2201/103; G01J 1/44
See application file for complete search history.

(56) References Cited

U.S. PATENT DOCUMENTS

| | | | |
|---|---|---|---|
| 8,977,140 B2 | 3/2015 | Suzuki | |
| 11,251,228 B2 | 2/2022 | Xie et al. | |
| 11,722,109 B1 * | 8/2023 | Zhang | H03F 3/19 |
| | | | 250/214 A |
| 2010/0260504 A1 | 10/2010 | Takahara | |
| 2013/0188965 A1 | 7/2013 | Afriat et al. | |
| 2015/0086221 A1 | 3/2015 | Shringarpure et al. | |
| 2016/0261361 A1 | 9/2016 | Nagarajan | |

(Continued)

FOREIGN PATENT DOCUMENTS

| | | |
|---|---|---|
| CN | 114866146 A | 8/2022 |
| JP | 2015-037276 A | 2/2015 |

OTHER PUBLICATIONS

Notice of Allowance on U.S. Appl. No. 17/980,478 DTD Mar. 27, 2023.

(Continued)

*Primary Examiner* — Thanh Luu
(74) *Attorney, Agent, or Firm* — Foley & Lardner LLP

(57) ABSTRACT

An optical module includes an optical receiver with a complementary metal-oxide semiconductor (CMOS) transimpedance amplifier (TIA) and a digital signal processing (DSP) circuit. The DSP circuit is integrated with the CMOS TIA and facilitates adaptability of the CMOS TIA, and the CMOS TIA can adapt by using information provided by the DSP circuit.

20 Claims, 3 Drawing Sheets

(56) References Cited

U.S. PATENT DOCUMENTS

| | | |
|---|---|---|
| 2017/0288618 A1 | 10/2017 | Asmanis et al. |
| 2017/0373761 A1* | 12/2017 | Parker ............... H04L 25/03006 |
| 2018/0316440 A1 | 11/2018 | Mita |
| 2018/0337815 A1 | 11/2018 | Huang et al. |
| 2019/0108161 A1 | 4/2019 | Nagarajan |
| 2019/0305809 A1* | 10/2019 | Joo .................... H03F 3/45941 |
| 2019/0372664 A1 | 12/2019 | Sugiyama |
| 2020/0162169 A1 | 5/2020 | Papanikolaou et al. |
| 2020/0363597 A1 | 11/2020 | He |
| 2021/0126594 A1 | 4/2021 | Lambrecht et al. |
| 2021/0159997 A1 | 5/2021 | Nagarajan |
| 2022/0216934 A1 | 7/2022 | Yamauchi |

OTHER PUBLICATIONS

Foreign Search Report on non-Foley case related to U.S. Appl. No. 18/335,217 DTD May 6, 2024.

* cited by examiner

INTEGRATED TRANSIMPEDANCE AMPLIFIER WITH A DIGITAL SIGNAL PROCESSOR FOR HIGH-SPEED OPTICAL RECEIVERS

CROSS-REFERENCE TO RELATED APPLICATION

This application is a continuation of and claims priority to and the benefit of U.S. patent application Ser. No. 17/980,478, titled "INTEGRATED TRANSIMPEDANCE AMPLIFIER WITH A DIGITAL SIGNAL PROCESSOR FOR HIGH-SPEED OPTICAL RECEIVERS," and filed on Nov. 3, 2022, the contents of all of which are hereby incorporated herein by reference in its entirety for all purposes.

TECHNICAL FIELD

The present description relates generally to optical communications including, for example, a complementary metal-oxide semiconductor (CMOS) integrated transimpedance amplifier (TIA) integrated with a digital signal processor (DSP) for high-speed optical receivers.

BACKGROUND

Current optical modules include stand-alone TIAs and are generally cost and power sensitive. The stand-alone bipolar TIA that is used in the optical modules can be responsible for a relatively large portion of the total cost and power consumption of the optical module. Attempts to integrate CMOS TIA with DSP to reduce one relatively small chip from a circuit board generally result in weak performance of the CMOS TIA, resulting in a bottleneck that prevents CMOS TIA integration from being used for high-end, ultra-high-speed (e.g., 400 Gigahertz or 400 G) optical modules for high-speed applications.

BRIEF DESCRIPTION OF THE DRAWINGS

Certain features of the subject technology are set forth in the appended claims. However, for purposes of explanation, several aspects of the subject technology are depicted in the following figures.

DETAILED DESCRIPTION

Figure 1:
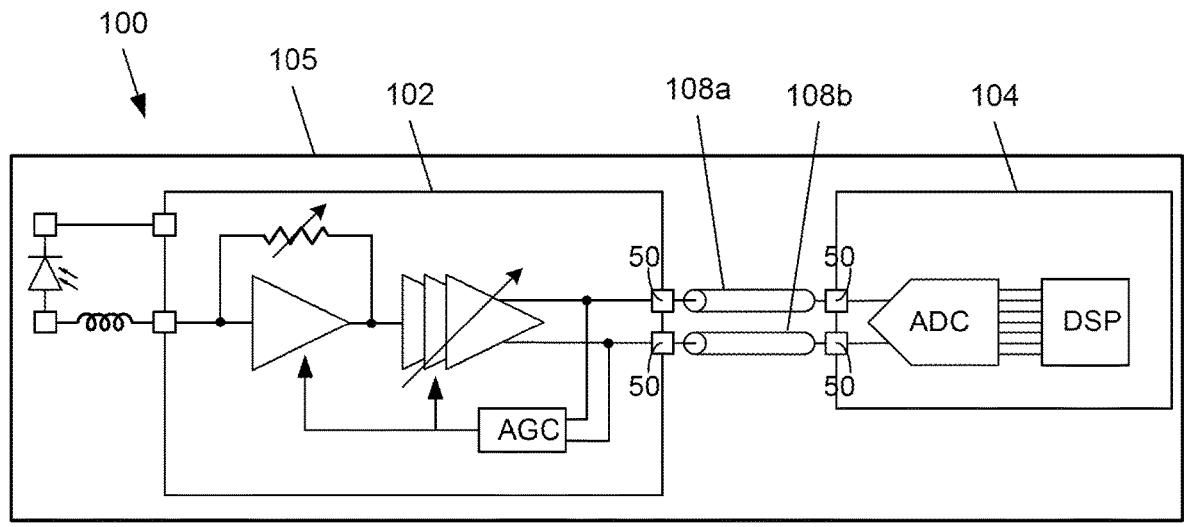
FIG. 1 illustrates a circuit diagram illustrating an example of a receiver system with a stand-alone TIA circuit.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block-diagram form in order to avoid obscuring the concepts of the subject technology.

According to some aspects, the subject technology is directed to optical modules used in high speed optical data transfer applications. Optical modules described herein are used in the conversion of electrical signals into optical signals, and vice versa. In some embodiments, an optical module includes a CMOS TIA circuit integrated with a DSP circuit. The CMOS TIA can be co-designed and merged with a DSP circuit in a receiver system to achieve a desired overall performance. By integrating the CMOS TIA with the DSP onto, for example, an integrated circuit, optimal modules described herein can eliminate the need for interconnections (e.g., bond wire, trace(s)) commonly found on a circuit board and located between a stand-alone TIA circuit and a stand-alone DSP circuit. As a result, the system performance is enhanced through fewer deflections, losses, and crosstalk. Moreover, as a result of TIA circuit integration and merger with a DSP circuit, optical modules described herein may be used in high-speed applications, including 400 G applications. Accordingly, optical modules described herein may include 400 G DR4 modules.

Further, by integrating the CMOS TIA circuit with the DSP circuit, the bandwidth of the TIA circuit can be adjusted, using the DSP circuit, and optimized for the overall receiver system bit-error rate (BER) as compared to using the output of stand-alone TIA circuits. This allows the capability of feed-forward equalization (FFE) and decision-feedback equalization (DFE) in DSP to be fully utilized.

Another aspect of the disclosed TIA circuits includes adaptation by DSP to accommodate various environments. For example, a TIA circuit may be required to communicate with different transmitters, through different channels, under process-voltage-temperature (PVT) corners, and input optical-modulation amplitudes (OMAs). The disclosed TIA circuits have several digitally controlled knobs to adapt its transfer function (frequency response) shape based on information provided by the DSP circuits. The DSP-assisted design can finely adapt the TIA circuit to find the desired performance in all situations, and transition the TIA transfer function when PVT or input signal has changed.

The subject technology further allows power supply adaptation by DSP circuit to achieve a desired performance and power. The DSP circuit can control the power supply of analog front-end to optimize TIA performance and power consumption, based on DSP circuit information. Furthermore, the disclosed solution allows adaptive gain allocation for best noise and total harmonic distortion (THD) trade-off to better balance the impact from the noise and THD, therefore, to achieve a desired overall performance.

FIG. 1 illustrates a schematic diagram illustrating an example of a receiver system 100 with a stand-alone TIA circuit 102, according to one approach. As shown, the stand-alone TIA 102 circuit (e.g., a chip or a die) and a stand-alone DSP circuit 104 (e.g., a chip or a die) are each located on a circuit board 105 (e.g., printed circuit board). The receiver system 100 is an existing solution, in which the stand-alone TIA circuit 102 is connected to the stand-alone DSP 104 via an interconnection 108a and an interconnection 108b. Each of the interconnections 108a and 108b terminates at 50-Ohm connections, i.e., 50-Ohm impedance pads. The interconnections 108a and 108b may include bond wires and/or traces on the circuit board 105. As shown, the interconnections 108a and 108b lie outside of the stand-alone TIA circuit 102 and the stand-alone DSP circuit 104. The interconnections 108a and 108b represent chip-to-chip connections or chip-to-package connections between the stand-alone TIA circuit 102 and the stand-alone DSP circuit 104.

Based on the stand-alone TIA circuit 102 and the interconnections 108a and 108b, attempts to reduce the overall footprint of the receiver system 100 may be limited. Also, the interconnections 108a and 108b can prevent optimization of the stand-alone TIA circuit 102 by the stand-alone DSP circuit 104. For example, the stand-alone DSP circuit 104 is unable to provide commands or feedback used to control or optimize the stand-alone TIA circuit 102, and the stand-alone TIA circuit 102 may only be able to self-optimize or self-control. The interconnection 108a and 108b need to connect to 50-Ohm impedance pads on the stand-alone TIA circuit 102 and stand-alone DSP circuit 104. Thus, the receiver system 100 may be susceptible to performance issues due to, for instance, power reflection and crosstalk, attenuation of the interconnections 108a and 108b, and may require matching impedance at the output nodes of the stand-alone TIA circuit 102 and the input nodes of the stand-alone DSP circuit 104.

Figure 2:
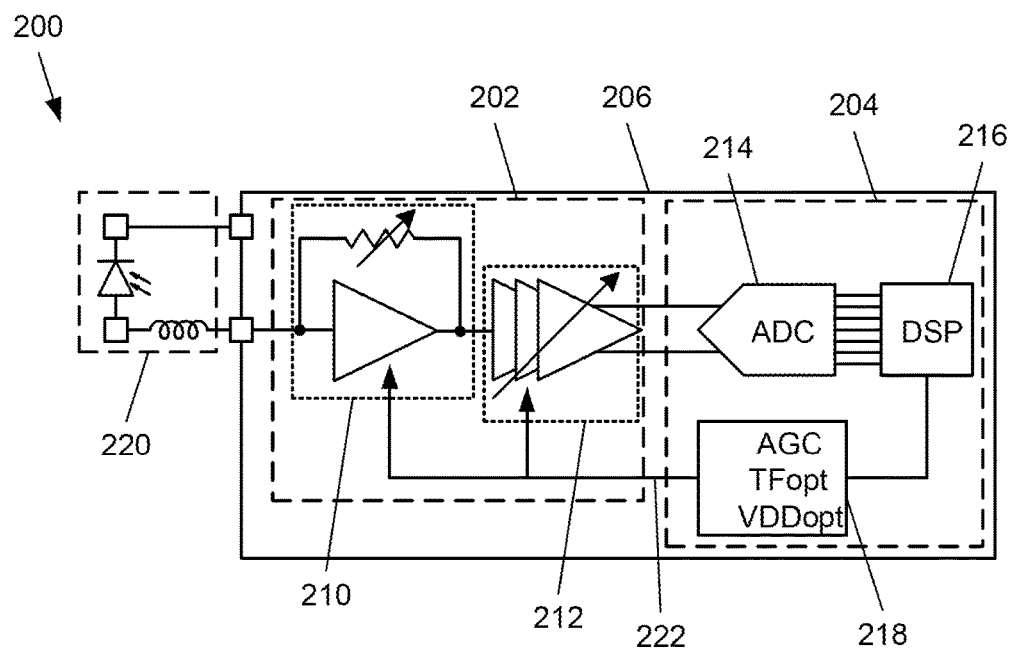
FIG. 2 illustrates a circuit diagram illustrating an example of a receiver system with an integrated amplifier circuit, according to aspects of the subject technology.

FIG. 2 illustrates a schematic diagram of a receiver system 200 with an integrated amplifier circuit, according to aspects of the subject technology. The receiver system 200 may be used in a high-speed optical module (e.g., operating at approximately 4×100 Gigabytes per second, or Gbps). As shown, the receiver system 200 includes an amplifier circuit 202 and a DSP circuit 204 integrated on a substrate 206, representing a single chip or single integrated circuit. In some embodiments, the amplifier circuit 202 is a TIA circuit. Further, in some embodiments, the amplifier circuit 202 operates at 100 Gbps. Further, in some embodiments, the amplifier circuit includes a CMOS TIA. Using CMOS technology, an amplifier circuit (e.g., amplifier circuit 202) can use transistors in digital circuit applications. Further, by merging the amplifier circuit 202 and the DSP circuit 204 together on the substrate 206 as a single integration, the amplifier circuit 202 and the DSP circuit 204 are electrically connected to each other in part by placing both the amplifier circuit 202 and the DSP circuit 204 onto a single chip. Additionally, the amplifier circuit 202 and the DSP circuit 204 are connected (e.g., electrically connected) on the substrate 206 without a connection(s) (e.g., interconnections 108a and 108b of FIG. 1) on the substrate 206 (e.g., without using impedance pads). Beneficially, the substrate 206 lacks interconnections (and associated impedance issues using the impedance pads) between the amplifier circuit 202 and the DSP circuit 204, and the DSP circuit 204 can provide commands, controls, and/or feedback to the amplifier circuit 202 in order to optimize and enhance performance of the amplifier circuit 202.

In some embodiments the amplifier circuit 202 is CMOS TIA, and may include a front stage 210 including a variable-feedback resistor $R_v$ and an amplifier, and a later stage 212 that includes a variable gain amplifier (VGA), including a 3-stage VGA. The DSP circuit 204 includes an analog-to-digital converter (ADC) 214, a DSP module 216, and an automatic gain control (AGC) unit 218. The ADC 214 converts the analog output of the amplifier circuit 202 to a digital signal for processing by the DSP module 216. The inputs of the ADC 214 are relatively high-impedance (Z) inputs, thereby allowing the output of the amplifier circuit 202 to have any arbitrary output impedance. In some embodiments, the AGC unit 218 can provide a relative constant output amplitude despite a varying incoming input. The ACG unit 218 may adapt and optimize a transfer function of the amplifier circuit 202 and/or provide and regulate supply voltage to the amplifier circuit 202. This will be further discussed below. As shown, a path 222 from the DSP circuit 204 to the amplifier circuit 202 can be used by the DSP circuit 204 to provide information such transfer function optimization information based upon changes in transmitter modules, channel status, temperature, voltage, process variation, and channel status. For example, the path 222 can provide feedback to the front stage 210 and to the later stage 212. Additionally, the path 222 be used the DSP circuit 204 to provide and regulate supply voltage to the amplifier circuit 202, and in particular, to the front stage 210 and to the later stage 212.

The receiver system 200 further includes a photodetector block 220, which includes a photoelectric converter that converts received optical signals (from a transmitter, not shown) into electrical signals, with the electrical signals being provided to the amplifier circuit 202. Based in part on the merger between the amplifier circuit 202 and the DSP circuit 204, the amplifier circuit 202 can work in conjunction with the photodetector block 220 and be compatible with different transmitters, photodiodes, and optical fibers. Beneficially, the amplifier circuit 202, in conjunction with controls and/or feedback from the DSP circuit 204, can adapt to transmitters, photodiodes, and/or optical fibers with different specifications (e.g., voltage requirements, current requirements) and from different manufacturers.

The receiver system 200 may include enhanced system performance when used with optical modules (including high-speed optical modules), as the need for an interconnection between the amplifier circuit 202 and the DSP circuit 204 is eliminated due to the integration of the amplifier circuit 202 with the DSP circuit 204. Without an interconnection(s) between the amplifier circuit 202 and the DSP circuit 204, performance improvements may include fewer reflections, fewer attenuations, and no matching impedance at both TIA output and the receiver input associated with the existing stand-alone TIA and the receiver DSP. Additionally, by removing interconnections and merging the amplifier circuit 202 with the DSP circuit 204 into a single integration, the overall footprint of the receiver system 200 may be reduced. Also, one or more parameters, such as bandwidth of the amplifier circuit 202, can be adjusted/controlled by a signal (e.g., control signal) provided the DSP circuit 204 to the amplifier circuit 202 for the overall receiver system BER instead of using quality of the output of the amplifier circuit 202. Thus, the receiver system 200 can fully utilize the capability of FFE and DFE in the DSP circuit 204. Stand-alone TIA (e.g., stand-alone TIA circuit 102, shown in FIG. 1) sets their own bandwidth & transfer function, so a (separate) DSP circuit (e.g., stand-alone DSP circuit 104, shown in FIG. 1) may not have a chance to fully utilize their respective FFE and DFE if the stand-alone TIA circuit sets the bandwidth or peaks too high. While with an integrated TIA (e.g., amplifier circuit 202), since FFE, DFE, and TIA transfer function are co-operated and optimized together, a DSP circuit (e.g., DSP circuit 204) will be able to fully utilize its equalization capability to achieve the best system performance, especially for DFE as it is a noise-free equalizer.

Figure 3:
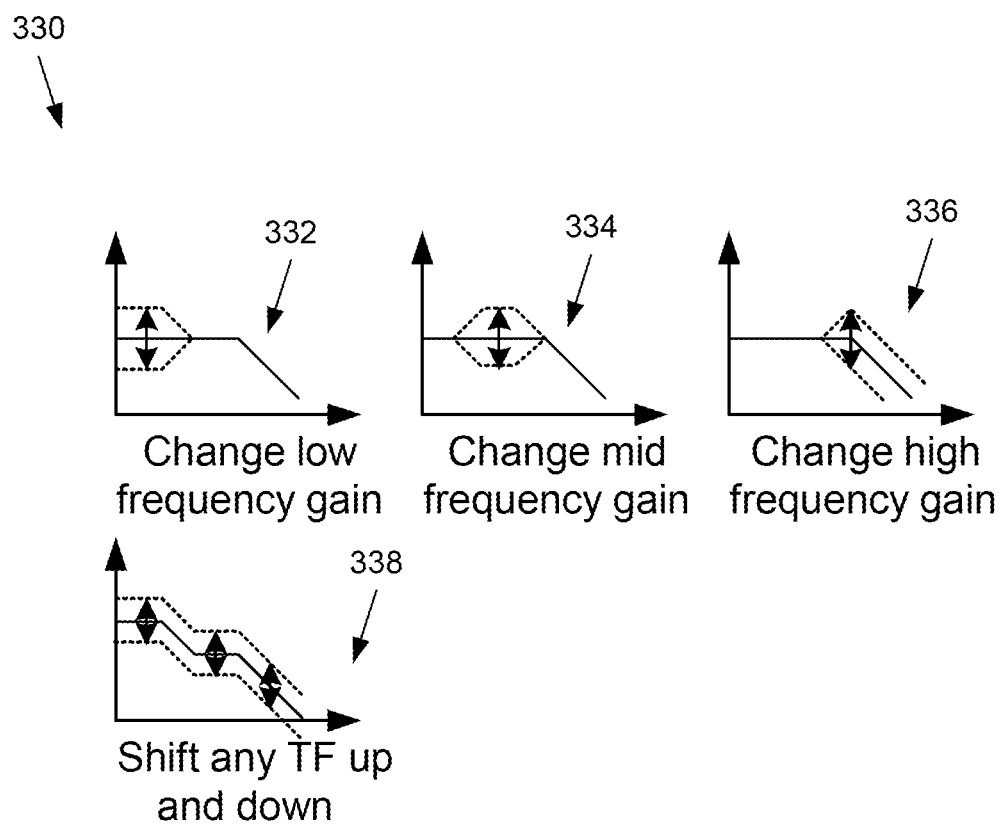
FIG. 3 illustrates corresponding transfer function plots, according to aspects of the subject technology.

FIG. 3 illustrates transfer function plots 330, according to aspects of the subject technology. An amplifier circuit (e.g., amplifier circuit 202) is designed to include several digitally controllable features that act as knobs, or tunable features, that can be controlled by a DSP circuit (e.g., DSP circuit 204 of FIG. 2). This may include, for example, the AGC unit 218. The transfer function plots 330 include various charts depicting the types of modifications and adaptations to a transfer function of an amplifier circuit. For example, a chart 332 shows a low-frequency gain of the transfer function changed based on the information provided by a DSP circuit. The plot 334 and the plot 336 show changing of a mid-frequency gain and a high-frequency gain, respectively, of the transfer function of an amplifier circuit based on the information provided by a DSP circuit. The plot 338 shows a change of the shape of the transfer function of a TIA circuit as a shift upward or a shift downward based on information provided by a DSP circuit.

Figure 4:
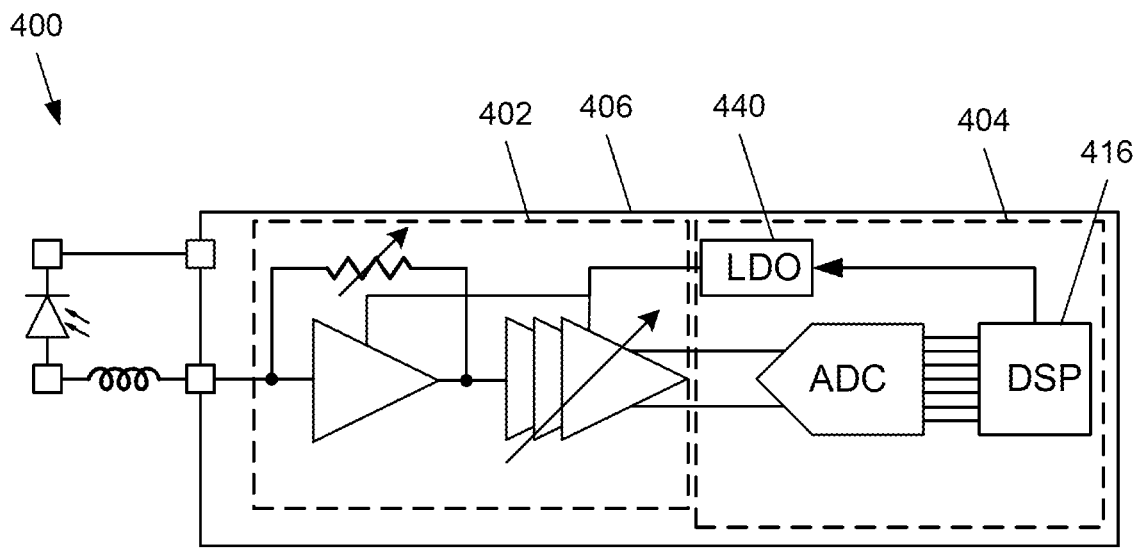
FIG. 4 illustrates a circuit diagram illustrating an example of a receiver system with DSP power supply control, according to aspects of the subject technology.

FIG. 4 is a schematic diagram illustrating an example of a receiver system 400 with DSP power supply control, according to aspects of the subject technology. The receiver system 400 represents a high-speed optical receiver (e.g., operating at approximately 4×100 Gbps). As shown, the receiver system 400 includes an amplifier circuit 402 and a DSP circuit 404 integrated onto a substrate 406, similar to the amplifier circuit 202, the DSP circuit 204, and the substrate 206, respectively, of FIG. 2. Additionally, the receiver system 400 includes a power supply 440. In some embodiments, the power supply 440 is implemented by a low-dropout regulator, or LDO regulator. In this regard, the power supply 440, when implemented as an LDO regulator, can regulate an output voltage from a relatively higher input voltage in digital circuits. The power supply 440 can provide and regulate power to the amplifier circuit 402. The DSP circuit 404 (including a DSP unit 416) can provide commands and other information to the power supply 440, and as a result, can improve performance and reduce power consumption of the amplifier circuit 402.

Figure 5A:
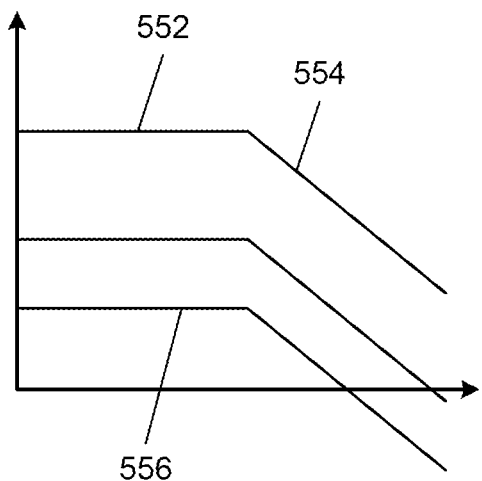
FIGS. 5A and 5B illustrate example plots depicting adaptive gain control to balance noise and total harmonic distortion (THD) of a receiver system with integrated TIA, according to aspects of the subject technology.
Figure 5B:
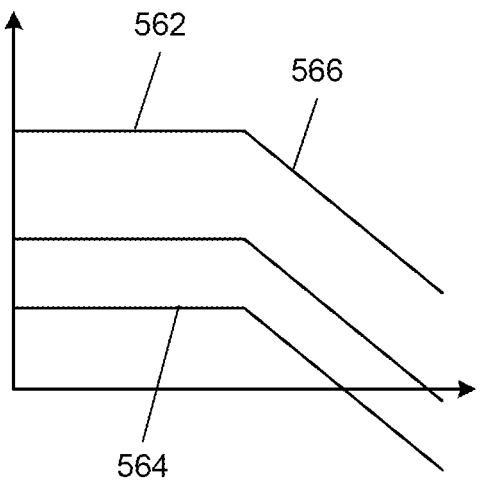

FIGS. 5A and 5B illustrate example plots depicting adaptive gain control to balance noise and THD of a receiver system with an integrated amplifier circuit (e.g., TIA circuit), according to aspects of the subject technology. The performance of the front-end circuit of an optical receiver can be limited either by the noise or the THD. In this regard, the noise and THD usually co-exist as a trade-off to each other. When the input signal is small, the noise is the dominant factor, and when input signal is large, the THD can have the greater influence on the performance of the optical receiver. In general, it is understood that with the same overall transfer function, reducing the system noise can be achieved by allocating more gain to the front stages, and reducing the system THD can be accomplished by allocating more gain to later stages. With the information and instruction from the DSP with which this CMOS TIA is integrated, the gain could be allocated properly between the front and later stages to best balance the impact from the noise and THD. In the case of the amplifier circuits of the subject technology, the gain of the TIA circuit output could be allocated properly between the front stage (e.g., front stage 210 of FIG. 2) and later stage (e.g., later stage 212 of FIG. 2) to balance the impact from the noise and THD, therefore, to achieve a desired overall performance.

The chart 550 in FIG. 5A is associated with a noise adjustment (optimization) scenario and includes a plot 552, a plot 554 and a plot 556. The plot 552 represents an overall transfer function, while the plots 554 and 556 represent transfer functions (frequency responses) of the gains of the front stage and a later stage, respectively, of an amplifier circuit. For this scenario (noise adjustment) the greater gain is allocated to the front stage to counter the effect of the noise. The plot 552 depicts an overall transfer function, which is the product of the two transfer functions shown by the plots 554 and 556.

The chart 560 in FIG. 5B is associated with a THD adjustment scenario and includes a plot 562, a plot 564 and a plot 566. The plots 564 and 566 represent transfer functions of the gains of the front stage and a later stage, respectively, of an amplifier circuit. For this scenario, the greater gain is allocated to later stages of the amplifier circuit to counter the effect of the THD. The plot 562 depicts an overall transfer function, which is the product of the two transfer functions shown by the plots 564 and 566.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein but are to be accorded the full scope consistent with the language of the claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its), and vice versa. Headings and subheadings, if any, are used for convenience only, and do not limit the subject disclosure.

The predicate words "configured to," "operable to," and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology, or that such aspect applies to all configurations of the subject technology. A disclosure relating to an aspect may apply to all configurations, or one or more configurations. A phrase such as an "aspect" may refer to one or more aspects, and vice versa. A phrase such as a "configuration" does not imply that such configuration is essential to the subject technology, or that such configuration applies to all configurations of the subject technology. A disclosure relating to a configuration may apply to all configurations, or one or more configurations. A phrase such as a "configuration" may refer to one or more configurations, and vice versa.

The word "example" is used herein to mean "serving as an example or illustration." Any aspect or design described herein as "example" is not necessarily to be construed as preferred or advantageous over other aspects or designs.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C,"

or alternatively, "at least one of A, at least one of B, and at least one of C," it is expressly described as such.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise", as "comprise" is interpreted when employed as a transitional word in a claim.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way), all without departing from the scope of the subject technology.

What is claimed is:

1. A circuitry comprising:
an optical receiver including a digital signal processor (DSP) coupled on a substrate with a transimpedance amplifier (TA), the DSP comprising an automatic gain control (AGC) unit;
wherein the TA is configured to have one or more parameters controlled by the DSP via a path from the AGC unit of the DSP to the TA, the path used to provide information to the TA to adapt a transfer function of the TA and regulate power supply of the TA; and
wherein the DSP is configured to control via the AGC and the path the one or more parameters of the transimpedance amplifier to adapt the transfer function of the TA responsive to a change in process-voltage-temperature (PVT), wherein the one or more parameters control one more of a low frequency gain, a medium frequency gain or a high frequency gain of the transfer function.

2. The circuitry of claim 1, wherein the DSP is further configured to provide adaptive gain allocation to trade-off between best noise and total harmonic distortion.

3. The circuitry of claim 1, wherein the DSP is further configured to control a power supply of an analog front-end to improve performance and power consumption of the TA.

4. The circuitry of claim 1, wherein the DSP is integrated with the TA on the substrate.

5. The circuitry of claim 1, wherein the DSP is directly connected with the TA.

6. The circuitry of claim 1, wherein the DSP and TA are on the substrate representing a single chip or a single integrated circuit.

7. The circuitry of claim 1, wherein circuitry of the DSP is merged with circuitry of the TA.

8. The circuitry of claim 1, further comprising a front-stage including a variable-feedback resistor and an amplifier and a later-stage including a variable gain amplifier, wherein a path from the DSP to the amplifier is used by the DSP to provide feedback to the front stage and the later stage.

9. A receiver comprising:
an amplifier circuitry configured to receive electronic signals from a photodetector, the photodetector converting optical signals to electrical signals;
a digital signal processor (DSP) circuitry comprising an automatic gain control (AGC) unit coupled to the amplifier circuitry on a substrate and configured to control one or more parameters of the amplifier circuitry;
and wherein a path from the AGC unit of the DSP to the amplifier circuitry is used to regulate power supply of the amplifier circuitry and provide transfer function information to adapt the transfer function of the amplifier circuitry based upon changes in at least one of temperature voltage and channel status, wherein the transfer function information is used to adapt one of a low frequency gain, a medium frequency gain or a high frequency gain of the transfer function.

10. The receiver of claim 9, wherein the amplifier circuitry is coupled with the DSP circuitry on the substrate representing a single chip.

11. The receiver of claim 9, further comprising a front-stage including a variable-feedback resistor and an amplifier and a later-stage including a variable gain amplifier, wherein a path from the DSP to the amplifier is used by the DSP to provide feedback to the front stage and the later stage.

12. The receiver of claim 9, wherein the amplifier circuitry is integrated with the DSP circuitry.

13. The receiver of claim 9, wherein the path from the DSP to the amplifier circuitry is used by the DSP to provide transfer function information further based on changes in a transmitter module and a process variation.

14. The receiver of claim 9, wherein the one or more parameters comprises bandwidth used by the TA.

15. The receiver of claim 9, wherein the one or more parameters comprises a transfer function, wherein the transfer function comprises an overall transfer function that is a product of two different transfer functions.

16. A device comprising:
a circuitry providing both a digital signal processor and an amplifier of an optical receiver, wherein an automatic gain control (AGC) unit of the digital signal processor and the amplifier are coupled on a substrate to reduce impedance issues;
wherein a transfer function of the amplifier is adjustable via a signal from the an automatic gain control (AGC) unit of the digital signal processor to the amplifier via a path from the AGC unit of the DSP to the amplifier, the path used to provide information to the amplifier to adapt the transfer function and regulate power supply of the amplifier.

17. The device of claim 16, wherein the amplifier is a transimpedance amplifier.

18. The device of claim 16, further comprising a power supply coupled to the amplifier to regulate power to the amplifier, wherein the digital signal processor is further configured to provide commands to the power supply.

19. The device of claim 18, wherein without a chip-to-chip or chip-to-package interconnection between the digital signal processor and the amplifier, the digital signal processor provides improvement to performance of the device with reduced reflections or attenuations.

20. The device of claim 16, wherein the digital signal processor and the amplifier are on the substrate representing a single chip or single integrated circuit.

* * * * *